(12) United States Patent
Brzozowy et al.

(10) Patent No.: US 6,911,297 B2
(45) Date of Patent: Jun. 28, 2005

(54) PHOTORESIST COMPOSITIONS

(75) Inventors: David Brzozowy, Bristol, RI (US); J. Thomas Kocab, Wyoming, RI (US); John P. Hatfield, Hope Valley, RI (US); Lawerence Ferreira, Fall River, MA (US); Andrew Blakeney, Seekonk, MA (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/465,000

(22) Filed: Jun. 19, 2003

(65) Prior Publication Data

US 2004/0072095 A1 Apr. 15, 2004

Related U.S. Application Data

(60) Provisional application No. 60/391,850, filed on Jun. 26, 2002.

(51) Int. Cl.⁷ .............................................. G03F 7/004
(52) U.S. Cl. ............................ 430/270.1; 430/281.1; 430/286.1; 430/322; 430/328; 430/330
(58) Field of Search ........................ 430/270.1, 281.1, 430/286.1, 322, 328, 330

(56) References Cited

U.S. PATENT DOCUMENTS

2004/0072094 A1 * 4/2004 Shima et al. ............ 430/270.1

FOREIGN PATENT DOCUMENTS

| JP | 2002131898 | 5/2002 | |
|----|------------|--------|----|
| JP | 2002131898 A * | 5/2002 | ............ G03F/7/004 |

OTHER PUBLICATIONS

English language abstract of JP 2002-131898.*
PCT International Search Report based off of PCT/US03/21031 with a filing date Aug. 25, 2004.

* cited by examiner

*Primary Examiner*—Amanda Walke
(74) *Attorney, Agent, or Firm*—Ohlandt, Greeley Ruggiero & Perle LLP

(57) ABSTRACT

Radiation sensitive compositions for use in producing a patterned image on a substrate comprise:
a) a first photoacid generator compound which comprises one or more compounds of the structure (A);

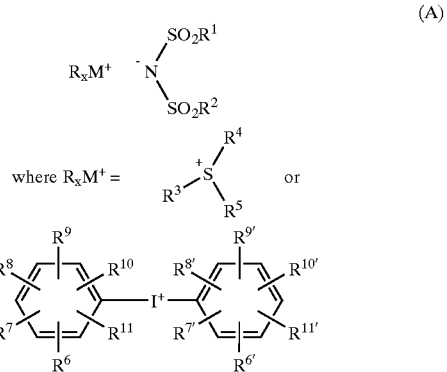

b) a second photoacid generator compound which comprises one or more compounds of the structure (B);

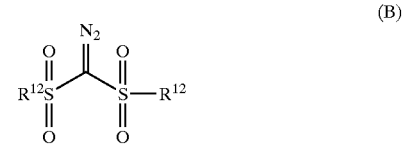

c) a polymer component comprising an alkali soluble resin component whose alkali solubility is suppressed by the presence of acid sensitive moieties and whose alkali solubility is returned by treatment with an acid and, optionally, heat; wherein said polymer comprises one or more polymers comprising the monomer unit (C);

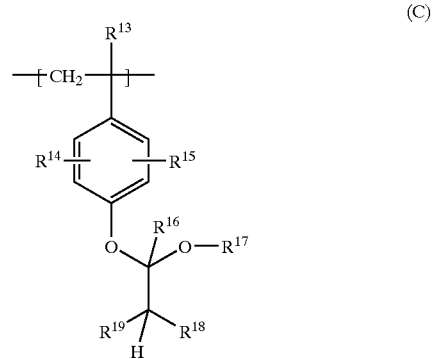

and
d) a solvent.

22 Claims, No Drawings

PHOTORESIST COMPOSITIONS

RELATED APPLICATION

This application claims priority from U.S. Provisional Application No. 60/391,850, filed Jun. 26, 2002.

FIELD OF THE INVENTION

This invention relates to photosensitive compositions with high resolution, excellent photospeed and excellent depth of focus while at the same time providing for decreasing line width and film thickness useful in the manufacture of semiconductor devices, and to the process of using such photosensitive compositions for producing imaged patterns on substrates for the production of such semiconductor devices.

BACKGROUND TO THE INVENTION

Advanced resists usually employ a technique called chemical amplification in which an acid generated by photolysis catalyzes a solubility switch from alkali insoluble to alkali soluble by removal of an acid sensitive group protecting an alkali solubilizing moiety. Polymers frequently used in this type of photosensitive composition include acetals derived from reaction of vinyl ethers with a polymer containing hydroxystyrene units. Chemically amplified resists based on acetal protected polyhydroxystyrene, such as found in U.S. Pat. Nos. 5,928,818, 5,834,531, and 5,558,976, which are incorporated herein by reference, are well known. Preferred characteristics and often advantages over other chemically amplified systems include lower temperature in processing conditions, and lower sensitivity to bake temperature variations.

As the semiconductor industry requires smaller and smaller features, the photoresists employed in the manufacture of semiconductor devices require improved resolution. As the required resolution becomes smaller, previously minor problems become more important to solve. Two such problems are a dependence of performance on film thickness and line collapse. As resolution requires increase, it is also more important to obtain as high a depth of focus as possible to help maintain processing latitude. The objective of this invention is to provide a photosensitive composition with high resolution, excellent photospeed, and excellent DOF at the same time as decreasing line collapse and film thickness dependence.

SUMMARY OF THE INVENTION

This invention concerns radiation sensitive compositions useful in the manufacture of semiconductor devices. These radiation sensitive compositions comprise:

a) a first photoacid generator (PAG) compound P1, which comprises one or more compounds of the structure (A);

b) a second photoacid generator compound P2 which comprises one or more compounds of the structure (B);

c) a polymer component comprising an alkali soluble resin component whose alkali solubility is suppressed by the presence of acid sensitive moieties and whose alkali solubility is returned by treatment with an acid and, optionally, heat; wherein said polymer comprises one or more polymers comprising the monomer unit (C); and d) a solvent, wherein structure (A) is the formula:

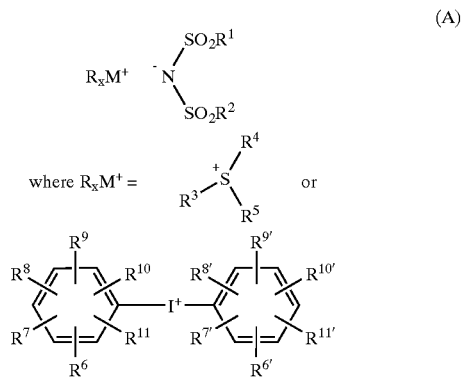

where $R^1$ and $R^2$ are each independently $C_1$–$C_{12}$ fluoroalkyl groups or together $R^1$ and $R^2$ are joined with the N to form a $(F_2C)_yN$ ring where y=4–12; $R^3$, $R^4$, and $R^5$ are each independently selected from unsubstituted aryl, alkyl or alpha-ketomethyl groups and such groups substituted with an acid sensitive group, or $R^3$ and $R^4$ together with the S atom form a cycloalkylsulfonium ring; $R^6$ to $R^{11}$ and $R^{6'}$ to-$R^{11'}$ are each independently selected from branched or linear alkyl, alkoxy, halogen, hydrogen, $OCO_2G$, $OCH_2CO_2G$, or OG where G=an acid sensitive group; wherein structure (B) has the formula:

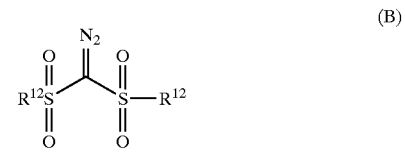

where each $R^{12}$ is independently selected from a linear, cyclic, or branched $C_1$–$C_8$ fluoroalkyl group, substituted or unsubstituted phenyl group, substituted or unsubstituted naphthalene group, $C_6$–$C_{12}$ cyclic or alicyclic hydrocarbon, or a linear, cyclic, or branched $C_1$–$C_8$ alkyl group; and wherein monomeric unit (C) has the formula:

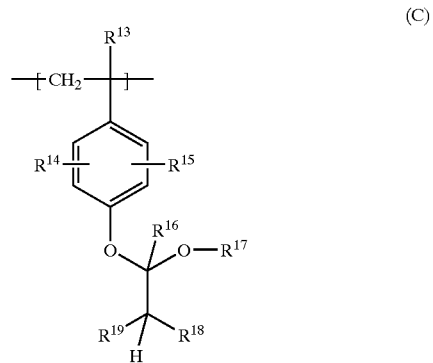

wherein $R^{13}$ is selected from H, $C_1$–$C_4$ lower alkyl, CN, or $CH_2CO_2R^{20}$; $R^{14}$ and $R^{15}$ are each independently selected from H, linear or branched $C_1$–$C_4$ alkyl, or halogen; $R^{16}$ is H, or branched or linear $C_1$–$C_4$ alkyl; $R^{17}$ is selected from substituted or unsubstituted phenyl, a substituted or unsubstituted linear, branched or cyclic $C_1$–$C_{20}$ alkyl, optionally containing an ether or ester group, a substituted or unsubstituted phenylalkylene or a substituted or unsubstituted $C_6$–$C_{20}$ cyclic alkylene; $R^{18}$ and $R^{19}$ are independently selected from H, linear or branched or cyclic $C_1$–$C_{14}$ alkyl, or $C_7$–$C_{14}$ alicyclic; $R^{20}$ is selected from a $C_1$–$C_{14}$ branched linear or cyclic alkyl, substituted or unsubstituted phenyl, or $C_7$–$C_{14}$ alicyclic group.

The photosensitive compositions of this invention may further comprise additives such as nitrogenous bases, dissolution inhibitors, coating additives, dyes, surfactants, and the like.

Preferred first photoacid generator compounds P1 are those compounds of structure A in which M=S and $R^1$ and $R^2$ are $C_1$–$C_6$ perfluoroalkyl. Most preferred compounds P1 are those compounds of structure (A) in which M=S, $R^1$ and $R^2$ are $C_1$–$C_6$ perfluoroalkyl, and $R^1$ is different from $R^2$.

Preferred second photoacid generator compounds P2 are those compounds of structure (B) in which $R^{12}$ is linear, branched, or cyclic $C_1$–$C_7$ alkyl.

Preferred polymers comprising the monomer unit (C) are those in which $R^{13}$, $R^{14}$, $R^{15}$, $R^{16}$, $R^{18}$, and $R^{19}$=H. More preferred polymers comprising the monomer unit C are those in which $R^{13}$, $R^{14}$, $R^{15}$, $R^{16}$, $R^{18}$, and $R^{19}$=H and $R^{17}$ is selected from $C_1$–$C_4$ linear or branched alkyl, or a substituted or unsubstituted $C_6$–$C_{20}$ cyclic alkylene or a substituted or unsubstituted linear, branched or cyclic $C_1$–$C_{20}$ alkyl, optionally containing an ether or ester group. Most preferred polymers comprising the monomer unit (C) are those in which $R^{13}$, $R^{14}$, $R^{15}$, $R^{16}$, $R^{18}$, and $R^{19}$,=H and $R^{17}$ is $C_1$–$C_4$ linear or branched alkyl, or a substituted or unsubstituted $C_6$–$C_{20}$ cyclic alkylene.

DETAILED DESCRIPTION OF INVENTION AND PREFERRED EMBODIMENTS

The radiation sensitive compositions of this invention comprise:

a) a first photoacid generator (PAG) compound P1, which comprises one or more compounds of the structure (A);

b) a second photoacid generator compound P2 which comprises one or more compounds of the structure (B);

c) a polymer component comprising an alkali soluble resin component whose alkali solubility is suppressed by the presence of acid sensitive moieties and whose alkali solubility is returned by treatment with an acid and, optionally, heat; wherein said polymer comprises one or more polymers comprising the monomer unit (C); and d) a solvent;

wherein the structures (A), (B) and monomeric unit (C) are as follows:

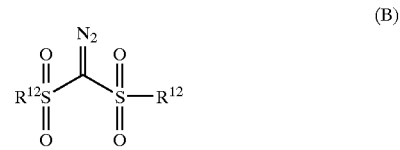

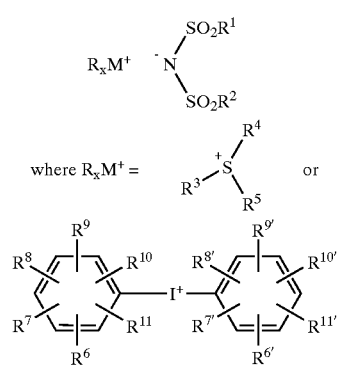

where $R^1$ and $R^2$ are each independently selected from $C_1$–$C_{12}$ fluoroalkyl groups or together $R^1$ and $R^2$ are joined with the N to form a $(F_2C)_yN$ ring where y=4–12; $R^3$, $R^4$, and $R^5$ are each independently selected from unsubstituted aryl, alkyl or alpha-ketomethyl groups and such groups substituted with an acid sensitive group or $R^3$ and $R^4$ together with the S atom form a cycloalkylsulfonium ring; $R^6$ to $R^{11}$ and $R^{6'}$ to $R^{11'}$ are each independently selected from branched or linear alkyl, alkoxy, halogen, hydrogen, $OCO_2G$, $OCH_2CO_2G$, or $OG$ where G=an acid sensitive group;

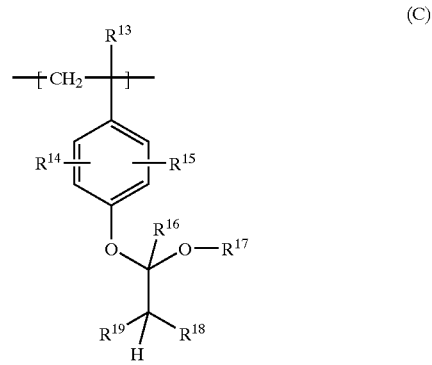

where each $R^{12}$ is independently selected from a linear, cyclic, or branched $C_1$–$C_8$ fluoroalkyl group, substituted or unsubstituted phenyl group, substituted or unsubstituted naphthalene group, $C_6$–$C_{12}$ cyclic or alicyclic hydrocarbon, or a linear, cyclic, or branched $C_1$–$C_8$ alkyl group;

wherein $R^{13}$ is selected from H, $C_1$–$C_4$ lower alkyl, CN, or $CH_2CO_2R^{20}$; $R^{14}$ and $R^{15}$ are each independently selected from H, linear or branched $C_1$–$C_4$ alkyl, or halogen; $R^{16}$ is selected from H, or branched or linear $C_1$–$C_4$ alkyl; $R^{17}$ is selected from substituted or unsubstituted phenyl, a substituted or unsubstituted linear, branched or cyclic $C_1$–$C_{20}$ alkyl, optionally containing an ether or ester group, a substituted or unsubstituted phenylalkylene or a substituted or unsubstituted $C_6$–$C_{20}$ cyclic alkylene; $R^{18}$ and $R^{19}$ are each independently selected from H, linear or branched or cyclic $C_1$–$C_{14}$ alkyl, or $C_7$–$C_{14}$ alicyclic; $R^{20}$ is selected from a $C_1$–$C_{14}$ branched linear or cyclic alkyl, substituted or unsubstituted phenyl, or $C_7$–$C_{14}$ alicyclic.

The total photoacid generator content of the photosensitive composition is 0.05 to 20 wt % of the solids content. The preferred range is from about 1 to about 15 wt %. The first photoacid generator compound P1 comprises about 25 to about 99 wt % of the total photoacid generator content. The second photoacid generator compound P2 comprises about 1 to about 75 wt % of the total amount of photoacid generator. Additional photoacid generators may be present. Preferably, the first photoacid generator compound P1 comprises about 35 to about 90 wt % of the total photoacid generator content. Most preferably, the first photoacid generator compound P1 comprises about 60 to about 80 wt % of the total photoacid generator content. Preferably, the second photoacid generator compound P2 comprises about 10 to about 65 wt % of the total amount of photoacid generator content. Most preferably, the second photoacid generator compound P2 comprises about 20 to about 40 wt % of the total amount of photoacid generator content.

The polymer component comprising an alkali soluble resin component whose alkali solubility is suppressed by the presence of acid sensitive moieties and whose alkali solubility is returned by treatment with an acid comprises from about 75 wt % to about 99 wt % of the solids content of the photosensitive composition. The preferred concentration is from about 80 wt % to about 95 wt %.

The choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating. Suitable solvents for the photoresist composition may include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. Preferred solvents are propylene glycol monomethyl ether acetate, 2-heptanone, and ethyl lactate.

The solids content of the resist may range from about 1 wt % to about 25 wt % depending on the photoresist thickness desired. The preferred solids content is from about 5 to about 15 wt %.

First photoacid generator compound P1 comprises one or more compounds of the structure (A).

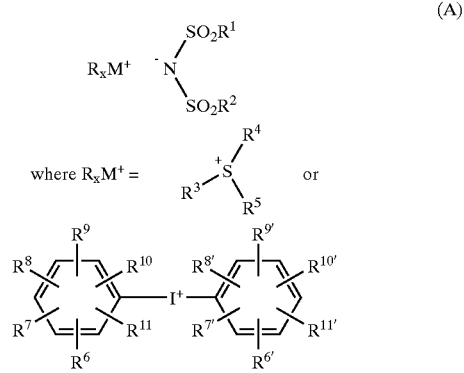

where $R^1$ and $R^2$ are each independently selected from $C_1$–$C_{12}$ fluoroalkyl groups or together $R^1$ and $R^2$ are joined with the N to form a $(F_2C)_y$N ring where y=4–12; $R^3$, $R^4$, and $R^5$ are each independently selected from substituted, substituted with an acid sensitive group, or unsubstituted aryl, alkyl or alpha-ketomethyl groups, or $R^3$ and $R^4$ together form a cycloalkylsulfonium ring; $R^6$ to $R^{11}$ and $R^{6'}$ to $R^{11'}$ are each independently selected from a branched or linear alkyl, alkoxy, halogen, hydrogen, $OCO_2G$, $OCH_2CO_2G$, or $OG$ where G=an acid sensitive group.

Examples of P1 may be synthesized by reaction of a salt of $(SO_2R^1)(SO_2R^2)N^-$ with a salt of $R_xM^+$ in a solvent. The preferred counter ion for $(SO_2R^1)(SO_2R^2)N^-$ is sodium and the preferred counter ion for $R_xM^+$ is the mesylate. The preferred solvent is water.

Suitable $(R^1SO_2NSO_2R^2)^-$ groups include but are not limited to

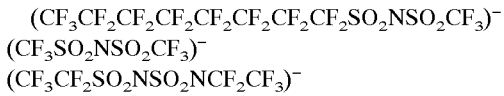

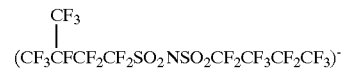

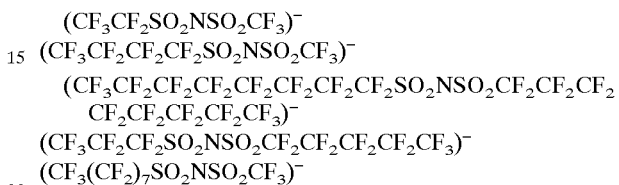

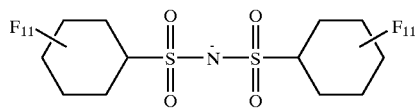

Suitable substituted or unsubstituted aryl $R^3R^4R^5S^+$ groups include but are not limited to:

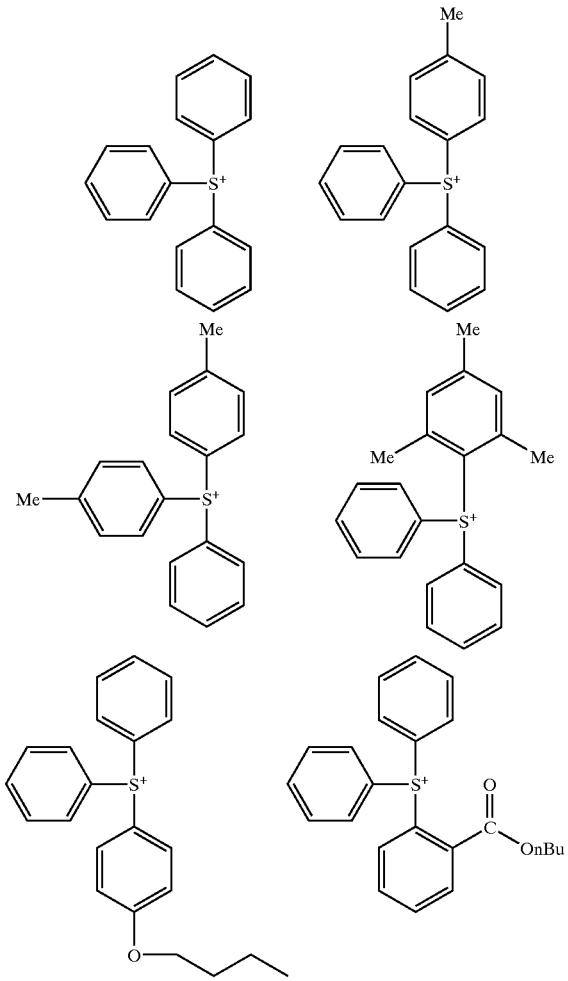

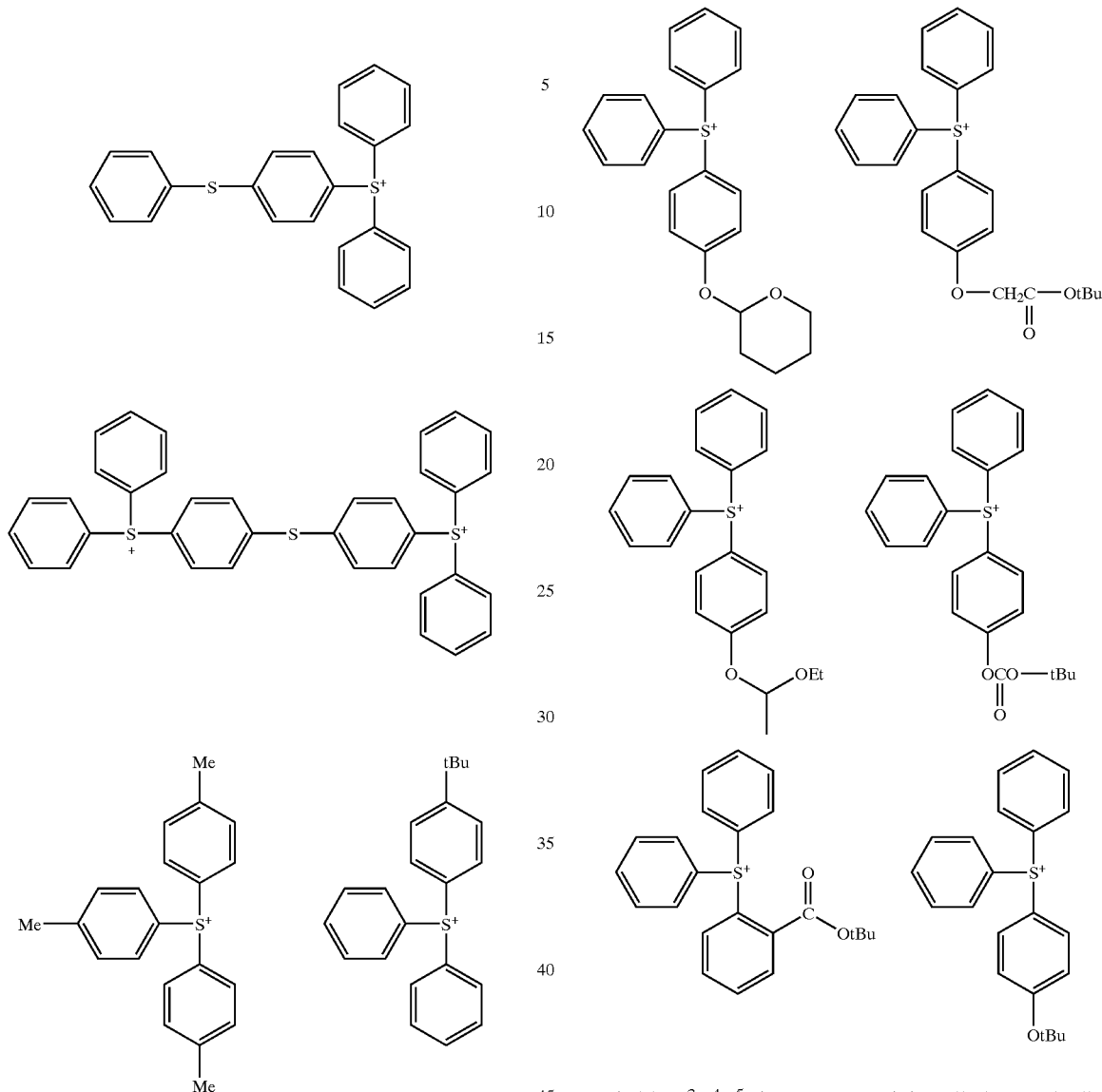
Suitable substituted aryl $R^3R^4R^5S^+$ groups with an acid sensitive group include but are not limited to:
Suitable $R^3R^4R^5S^+$ groups containing alkyl or cycloalkyl groups include but are not limited to:
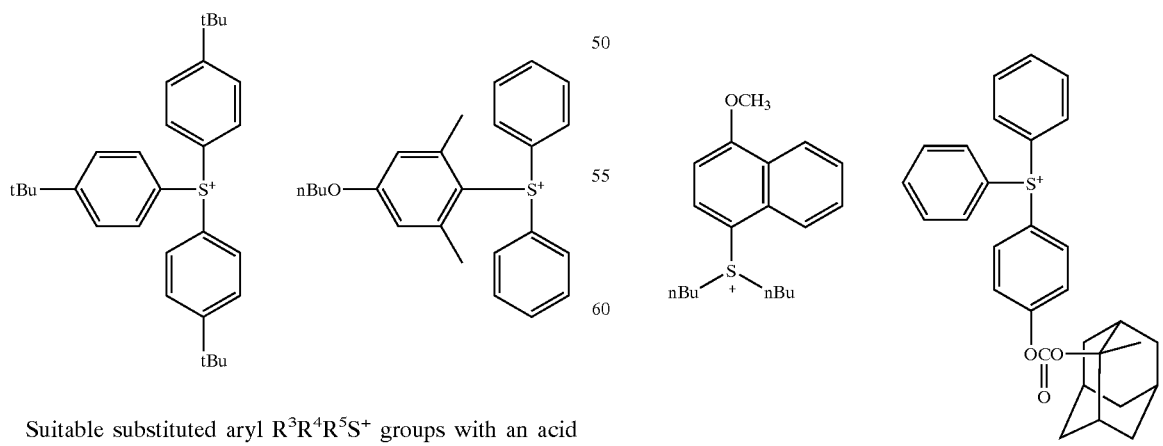

-continued

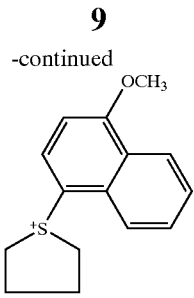

Suitable R³R⁴R⁵S⁺ groups containing alpha-ketomethyl groups include but are not limited to:

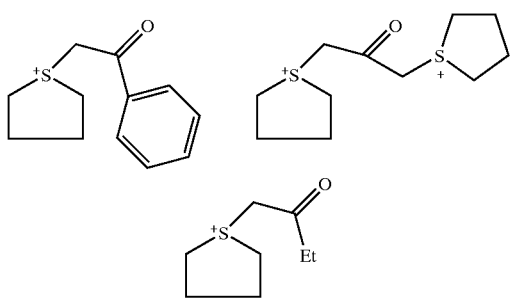

The diaryl iodonium cations include but are not limited to:

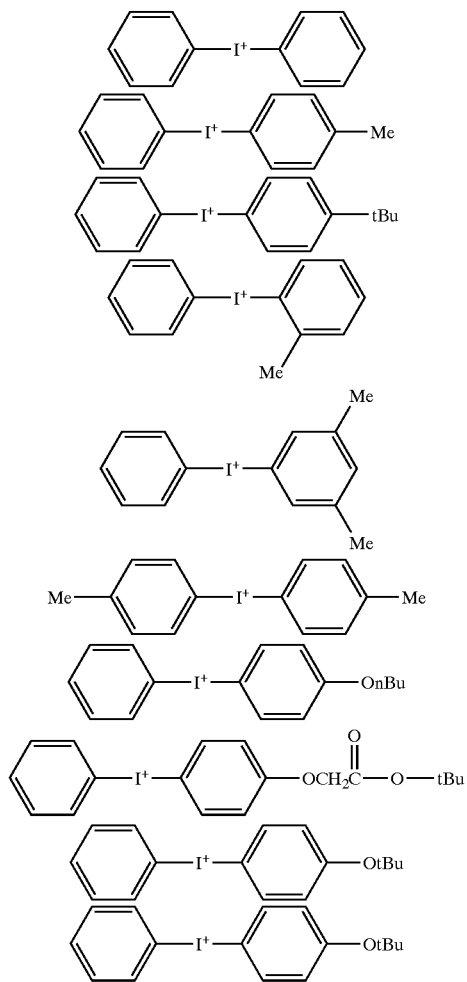

-continued

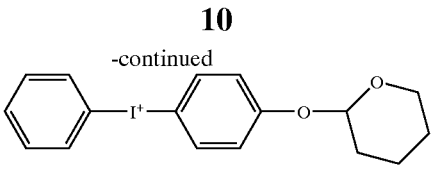

Second photoacid generator compound P2 comprises one or more compounds of the structure (B)

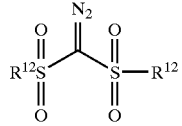
(B)

where each $R^{12}$ is independently selected from a linear, cyclic, or branched $C_1$–$C_8$ fluoroalkyl group, substituted or unsubstituted phenyl group, substituted or unsubstituted naphthalene group, $C_6$–$C_{12}$ cyclic or alicyclic hydrocarbon, or a linear, cyclic, or branched $C_1$–$C_8$ alkyl group. Examples of suitable $R^{12}$ groups include but are not limited to Me, Et, n-Bu, t-Bu, cyclohexyl, perfluorobutyl, phenyl, methoxyphenyl, bromophenyl, 4-methoxynaphthalene, naphthalene, and adamantyl. Examples of P2 are commercially available from Wako Chemical.

The polymer component of the photosensitive compositions comprises an alkali soluble resin component whose alkali solubility is suppressed by the presence of acid sensitive moieties and whose alkali solubility is returned by treatment with an acid and, optionally, heat; wherein said polymer comprises one or more polymers comprising the monomer unit (C).

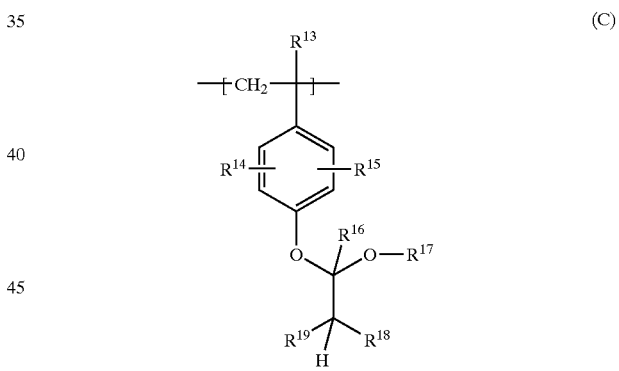
(C)

wherein $R^{13}$ is selected from H, $C_1$–$C_4$ lower alkyl, CN, or $CH_2CO_2R^{20}$; $R^{14}$ and $R^{15}$ are each independently selected from H, linear or branched $C_1$–$C_4$ alkyl, or halogen; $R^{16}$ is H, or branched or linear $C_1$–$C_4$ alkyl; $R^{17}$ is selected from substituted or unsubstituted phenyl, a substituted or unsubstituted linear, branched or cyclic $C_1$–$C_{20}$ alkyl, optionally containing an ether or ester group, a substituted or unsubstituted phenylalkylene or a substituted or unsubstituted $C_6$–$C_{20}$ cyclic alkylene; $R^{18}$ and $R^{19}$ are each independently selected from H, linear or branched or cyclic $C_1$–$C_{14}$ alkyl, or $C_7$–$C_{14}$ alicyclic; $R^{20}$ is a $C_1$–$C_{14}$ branched linear or cyclic alkyl, substituted or unsubstituted phenyl, or $C_7$–$C_{14}$ alicyclic. Each polymer comprising the monomer C in the photosensitive composition comprises from about 10% to about 90% of the total polymer.

Preferred polymers comprising the monomer unit (C) are those in which $R^{13}$, $R^{14}$, $R^{15}$, $R^{16}$, $R^{18}$, and $R^{19}$=H. More preferred polymers comprising the monomer unit C are those in which $R^{13}$, $R^{14}$, $R^{15}$, $R^{16}$, $R^{18}$, and $R^{19}$,=H and $R^{17}$ is selected from $C_1$–$C_4$ linear or branched alkyl, or a substituted or unsubstituted $C_6$–$C_{20}$ cyclic alkylene or a substituted or unsubstituted linear, branched or cyclic $C_1$–$C_{20}$ alkyl, optionally containing an ether or ester group. Most preferred polymers comprising the monomer unit C are those in which $R^{13}$, $R^{14}$, $R^{15}$, $R^{16}$, $R^{18}$, and $R^{19}$,=H and $R^{17}$ is selected from $C_1$–$C_4$ linear or branched alkyl, or a substituted or unsubstituted $C_6$–$C_{20}$ cyclic alkylene.

Polymers and copolymers comprising the monomer unit (C) can be synthesized by polymerization of the corresponding styrenic precursor to monomer unit (C) using any suitable means of polymerization known to those in the art. If this method is employed, then the styrenic precursor is typically synthesized from the reaction of hydroxystyrene with the corresponding alpha halo ether under basic conditions.

A preferred method of synthesis of polymers and copolymers comprising the monomer unit (C) is to prepare hydroxystyrene polymers and copolymers via standard polymerization methods (e.g. free radical) and then react the polymer with a vinyl ether (D) under acidic conditions. Examples of suitable syntheses may be found in U.S. Pat. Nos. 5,670,299 and 6,033,826 herein incorporated by reference.

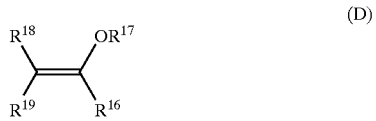

(D)

An alternatively preferred method is to react the hydroxystyrene polymer or copolymer with a vinyl ether (e.g. t-butyl vinyl ether) in the presence of an alcohol ($R^{17}$—OH) and an acid catalyst. Examples of this synthetic process can be found in U.S. Pat. Nos. 6,159,653, 6,133,412 and 6,309,793, herein incorporated by reference.

Each polymer employed in this invention may contain more than one different monomer unit (C).

The polymer employed in this invention may further comprise additional monomers. Suitable monomers include radical polymerizable vinyl monomers such as acrylates, methacrylates, vinyl ethers, vinyl esters, substituted and unsubstituted styrenes and the like. In an additional preferred embodiment, the preferred polymers further comprise monomer units of hydroxystyrene.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to 50% by weight of the photoacid generator compound. Nitrogenous bases are preferred. Suitable examples of base additives are 2-methylimidazole, tetramethyl ammonium hydroxide, tetrabutylammonium hydroxide, triisopropylamine, 4-dimethylaminopryidine, 4,4'-diaminodiphenyl ether, 2,4,5-triphenylimidazole, and 1,5-diazabicyclo[4.3.0]non-5-ene, and 1,8-diazabicyclo[5.4.0]undec-7-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812, which is incorporated herein by reference.

The photoresist composition may further comprise conventional additives, such as adhesion promoters, dissolution inhibitors, and surfactants. A person skilled in the art will be able to choose the appropriate desired additive and its concentration.

The photoresist composition is applied uniformly to a substrate by known coating methods. For example, the coatings may be applied by spin-coating, dipping, knife coating, lamination, brushing, spraying, and reverse-roll coating. The coating thickness range generally covers values of about 0.1 to more than 10 μm. After the coating operation, the solvent is generally removed by drying. The drying step is typically a heating step called 'soft bake' where the resist and substrate are heated to a temperature of about 50° C. to 150° C. for about a few seconds to a few minutes; preferably for about 5 seconds to 30 minutes depending on the thickness, the heating element and end use of the resist.

The photoresist compositions are suitable for a number of different uses in the electronics industry. For example, it can be used as electroplating resist, plasma etch resist, solder resist, resist for the production of printing plates, resist for chemical milling or resist in the production of integrated circuits. The possible coatings and processing conditions of the coated substrates differ accordingly.

For the production of relief structures, the substrate coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamp, KrF excimer lasers, ArF excimer lasers, electron beams and x-rays sources.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 300 seconds.

After imagewise exposure and any heat treatment of the material, the exposed areas of the photoresist are removed by dissolution in a developer. The choice of the particular developer depends on the type of photoresist; in particular on the nature of the polymer resin or the photolysis products generated. The developer can include aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

Synthetic Procedures

PAG Synthesis Example 1

Synthesis of 4-(1-butoxyphenyl)diphenylsulfonium Mesylate

In a 500 ml, round bottom flask equipped with a reflux condenser was combined n-butyl phenyl ether (40.4 g, 0.269 mol), diphenylsulfoxide (48 g, 0.237 mol) and Eaton's Reagent (154 g). An exothermic reaction occurred. The reaction mixture was maintained at 50–55° C. with stirring for 5 hours. The reaction mixture was then added to deionized water (1200 ml). This mixture was stirred for 30 minutes. The mixture was extracted two times with toluene (2×300 ml). The pH of the lower aqueous layer was adjusted to 8–8.5 by addition of a 25% aqueous solution of tetramethylammonium hydroxide (573.0 g).

PAG Synthesis Example 2

Synthesis of 2,4,6-trimethylphenyidiphenylsulfonium Mesylate

In a 1 L, round bottom flask equipped with a reflux condenser was combined 1,3,5-trimethylbenzene (40 g, 0.333 mol), diphenylsulfoxide (67.3 g, 0.333 mol) and Eaton's Reagent (160 g). An exothermic reaction occurred. The reaction mixture was maintained at 50–55° C. with stirring for 5 hours. The reaction mixture was then added to deionized water (800 ml). This mixture was stirred for 30 minutes. The mixture was extracted two times with toluene (2×250 ml). The pH of the lower aqueous layer was adjusted to 8–8.5 by addition of a 25% aqueous solution of tetramethylammonium hydroxide (889.6 g).

PAG Synthesis Example 3

Synthesis of sodium bis-(perfluorobutanesulfonyl)imide

In a 250 ml beaker equipped with a stirbar and a pH meter was combined bis-(perfluorobutanesulfonyl) amide (15 g, 60% acid w/w in water, 0.0155 mol) and deionized water (105 g). To the solution, sodium hydroxide (approximately 1.9 g, 33% w/w in water) was slowly added until the pH was above 7.0. The solution became viscous. The solution was maintained at room temperature with stirring for 15 minutes. The salt solution was used immediately and without further work-up in subsequent PAG synthesis.

PAG Synthesis Example 4

Synthesis of sodium bis-(perfluoroethanesulfonyl)imide

In a 250 ml beaker equipped with a stirbar and a pH meter was combined bis-(perfluoroethanesulfonyl) amide (2.0 g, 0.00525 mol) and deionized water (30 g). To the solution, sodium hydroxide (approximately 0.7 g, 33% w/w in water) was slowly added until the pH was above 7.0. The solution was maintained at room temperature with stirring for 15 minutes. The salt solution was used immediately and without further work-up in subsequent PAG synthesis.

PAG Synthesis Example 5

Synthesis of 4-(1-butoxyphenyl)diphenylsulfonium bis-(perfluorobutanesulfonyl)imide (PAG 1)

To a previously prepared solution containing 0.00517 mol sodium bis-(perfluorobutanesulfonyl)imide in 35 grams water was added 2.23 grams (0.00517 mol) of 4-(1-butoxyphenyl)diphenylsulfonium mesylate. A white suspension immediately formed. 50 ml of ethyl acetate was then added to the suspension. The resulting mixture was stirred for 24 hours. The bottom water layer was removed. The ethyl acetate layer was washed four times with 40 ml portions of deionized water. The ethyl acetate layer was then dried over magnesium sulfate. The magnesium sulfate was removed by filtration. Ethyl acetate was removed from the filtrate on a rotary evaporator affording 3.87 grams of a viscous oil. The $^{19}F$ NMR spectrum contained the following resonance bands: δ −80.8(t, 3F), −112.7(t, 2F), −120.6(t, 2F), −125.6(q, 2F). The $^1H$ NMR contained: δ 1.0(t, 3H), 1.5(sextet, 2H), 1.8(pentet, 2H), 4.2(t, 2H), 7.4(d, 2H), 7.9(multiplet, 12H).

PAG Synthesis Example 6

Synthesis of 4-(1-butoxyphenyl)diphenylsulfonium bis-(perfluoroethanesulfonyl)imide (PAG 2)

To a previously prepared solution containing 0.00694 mol sodium salt prepared in Example 4 in 38 grams water was added 2.99 grams (0.00694 mol) of 4-(1-butoxyphenyl)diphenylsulfonium mesylate. A white suspension immediately formed. 50 ml of ethyl acetate was then added to the suspension. The resulting mixture was stirred for 24 hours. The bottom water layer was removed. The ethyl acetate layer was washed four times with 40 ml portions of deionized water. The ethyl acetate layer was then dried over magnesium sulfate. The magnesium sulfate was removed by filtration. Ethyl acetate was removed from the filtrate on a rotary evaporator affording 4.3 grams of a viscous oil. The $^{19}F$ NMR spectrum contained the following resonance bands: δ −80.1(s, 3F), −118.3(s, 2F). The $^1H$ NMR contained: δ 1.0(t, 3H), 1.5(sextet, 2H), 1.8(pentet, 2H), 4.2(t, 2H), 7.4(d, 2H), 7.9(multiplet, 12H).

PAG Synthesis Example 7

Synthesis of 2,4,6-trimethylphenyldiphenylsulfonium bis-(perfluorobutanesulfonyl)imide (PAG 3)

To a previously prepared solution containing 0.00523 mol sodium salt prepared in Example 3 in 40 grams water was added 2.10 grams (0.00523 mol) of 2,4,6-trimethylphenyldiphenyl sulfonium mesylate. A white suspension immediately formed. 60 ml of ethyl acetate was then added to the suspension. The resulting mixture was stirred for 24 hours. The bottom water layer was removed. The ethyl acetate layer was washed four times with 40 ml portions of deionized water. The ethyl acetate layer was then dried over magnesium sulfate. The magnesium sulfate was removed by filtration. Ethyl acetate was removed from the filtrate on a rotary evaporator affording 3.71 grams of a viscous oil. The $^{19}F$ NMR spectrum contained the following resonance bands: δ −82.2(t, 3F), −114.2(t, 2F), −121.9(t, 2F), −127.1(q, 2F). The $^1H$ NMR contained: δ 2.2(s, 6H), 2.3(s, 3H), 7.3(s, 2H), 7.8(multiplet, 10H).

PAG Synthesis Example 8

Synthesis of 2,4,6-trimethylphenyidiphenylsulfonium bis-(perfluoroethanesulfonyl)imide (PAG 4)

To a previously prepared solution containing 0.00689 mol sodium salt prepared in Example 2 in 40 grams water was added 2.76 grams (0.00689 mol) of 2,4,6-trimethylphenyidiphenylsulfonium mesylate. A white suspension immediately formed. 60 ml of ethyl acetate was then added to the suspension. The resulting mixture was stirred for 24 hours. The bottom water layer was removed. The ethyl acetate layer was washed four times with 40 ml portions of de-ionized water. The ethyl acetate layer was then dried over magnesium sulfate. The magnesium sulfate was removed by filtration. Ethyl acetate was removed from the filtrate on a rotary evaporator affording 3.4 grams of a solid. The $^{19}$F NMR spectrum contained the following resonance bands: δ −80.0(s, 3F), −118.3(s, 2F). The $^1$H NMR contained: δ 2.2(s, 6H), 2.3(s, 3H), 7.3(s, 2H), 7.8 (multiplet, 10H).

PAG Synthesis Example 9
Synthesis of toluenediphenylsulfonium bis-(perfluorobutanesulfonyl)imide (PAG 5)

To a previously prepared solution containing 0.00344 mol sodium salt prepared in Example 3 in 51 grams water was added 1.39 grams (0.00344 mol) of toluenediphenylsulfonium iodide. 70 grams of ethyl acetate was then added to the suspension. The resulting mixture was stirred for 48 hours. The bottom water layer was removed. The ethyl acetate layer was washed three times with 40 ml portions of deionized water. The ethyl acetate layer was then dried over magnesium sulfate. The magnesium sulfate was removed by filtration. Ethyl acetate was removed from the filtrate on a rotary evaporator affording 2.78 grams of a semi-viscous oil. The $^{19}$F NMR spectrum contained the following resonance bands: δ −82.2(t, 3F), −114.2(t, 2F), −121.9(t, 2F), −127.1(q, 2F). The $^1$H NMR contained: δ 2.5(s, 3H), 7.7(d, 2H), 7.9(multiplet, 12H).

PAG Synthesis Example 10
Synthesis of toluenediphenylsulfonium bis-(perfluoroethanesulfonyl)imide (PAG 6)

To a previously prepared solution containing 0.00525 mol sodium salt prepared in Example 4 in 60 grams water was added 2.12 grams (0.00525 mol) of toluenediphenylsulfonium iodide. 51 grams of ethyl acetate was then added to the suspension. The resulting mixture was stirred for 48 hours. The bottom water layer was removed. The ethyl acetate layer was washed three times with 40 ml portions of deionized water. The ethyl acetate layer was then dried over magnesium sulfate. The magnesium sulfate was removed by filtration. Ethyl acetate was removed from the filtrate on a rotary evaporator affording 2.56 grams of an oil. The $^{19}$F NMR spectrum contained the following resonance bands: δ −80.1(s, 3F), −118.4(s, 2F). The $^1$H NMR contained: δ 2.5(s, 3H), 7.7(d, 2H), 7.9(multiplet, 12H).

PAG Synthesis Example 11
Synthesis of toluenediphenylsulfonium-(trifluoromethyl perfluorobutylsulfonyl)imide (PAG 7)

To a previously prepared solution containing 0.0034 mol lithium salt of trifluoromethyl perfluorobutylsulfonyl)imide (obtained from 3M Corporation) in 50 grams water was added 1.39 grams (0.0034 mol) of toluenediphenylsulfonium iodide. 70 ml of ethyl acetate was then added to the suspension. The resulting mixture was stirred for 24 hours. The bottom water layer was removed. The ethyl acetate layer was washed four times with 40 ml portions of deionized water. The ethyl acetate layer was then dried over magnesium sulfate. The magnesium sulfate was removed by filtration. Ethyl acetate was removed from the filtrate on a rotary evaporator affording 2.8 grams of a white solid. The $^{19}$F NMR spectrum contained the following resonance bands δ −80.3(s, 3F), −82.1(tt, 3F), −114.3(s, 2F), −122.02(m, 2F), −127.01(q, 2F). The $^1$H NMR contained: δ 2.5(s, 3H), 7.7(d, 2H0), 7.9(multiplet, 12H).

PAG Synthesis Example 12
Synthesis of tris-(tert-butylphenyl)sulfonium-(trifluoromethyl perfluorobutylsulfonyl)imide (PAG 8)

To a previously prepared solution containing 0.0034 mol lithium salt of trifluoromethyl perfluorobutylsulfonyl)imide (obtained from 3M Corporation) in 50 grams water was added 1.78 grams (0.0034 mol) of tris-(tert-butylphenyl) sulfonium tetrafluoroborate. 70 ml of ethyl acetate was then added to the suspension. The resulting mixture was stirred for 24 hours. The bottom water layer was removed. The ethyl acetate layer was washed four times with 40 ml portions of deionized water. The ethyl acetate layer was then dried over magnesium sulfate. The magnesium sulfate was removed by filtration. Ethyl acetate was removed from the filtrate on a rotary evaporator affording 2.52 grams of a white solid. The $^{19}$F NMR spectrum contained the following resonance bands δ −80.1(s, 3F), −82.3(tt, 3F), −114.3(s, 2F), −122.02(m, 2F), −127.01(q, 2F). The $^1$H NMR contained: δ 1.4(s, 27H), 7.8(AB quartet, 12H).

Polymer P1
Preparation of 4-[1-(2-cyclohexylethoxy)-ethoxy]styrene-co-4-[1-(t-butoxy)-ethoxy]styrene-co-4-hydroxy styrene-co-4-t-butylstyrene Copolymer A 250 mL round-bottom, three-necked flask was equipped with a temperature probe, a magnetic stir bar and closed vacuum adapter. 134.9 g of propylene glycol monomethyl ether acetate (PGMEA) was charged into the flask. 30.0 g of powdered poly(hydroxystyrene-co-t-butylstyrene) (93:7) (MW 12780; PD 1.9) was added to the stirring solvent. The mixture was stirred for 30 minutes to form a homogeneous solution. The mixture was heated to 60° C. and vacuum was applied to the solution to distill 48.92 g of the solvent. The solution was allowed to cool to room temperature under nitrogen atmosphere. 4.15 g of tertiary-butyl vinyl ether and 4.69 g 2-cyclohexylethanol were added to the homogeneous solution. 0.30 g of 1% para-toluene sulfonic acid (prepared by dissolving 1 g of acid in 99 g of PGMEA) was added. After a brief, mild exotherm, the solution was allowed to stir at 23° C. for 4 hours. 3.77 g of 1% triethylamine solution in PGMEA was added to the reaction mixture to quench the acid. The reaction mixture was stirred for an additional 30 minutes. The polymer solution was transferred to a 500 mL separatory funnel and treated with 115 g of acetone, 46 g of hexanes and 46 g of de-ionized water. The mixture was shaken for about 30 seconds to a minute and allowed to separate into two layers. The lower, aqueous layer was discarded. The top organic layer was subjected to two more washings. In the second washing, 23 g of acetone, 7 g of PGMEA and 23 g of deionized water were used and in the third washing, 17 g of acetone, 7 g of PGMEA and 23 g of deionized water were used.

The top organic layer was transferred to a 500 mL round-bottom, three-necked flask equipped with a temperature probe, magnetic stir bar and a vacuum distillation assembly. The flask was placed on a heating mantle. Acetone and hexane were removed by atmospheric distillation. Water and some PGMEA were removed by azeotropic vacuum distillation at 66° C. until the solids content of the distillation flask was about 30.17%. Analytical data is found in the table. The structure of the polymer is given below (a=0.76; b=0.07; c=0.04; d=0.13).

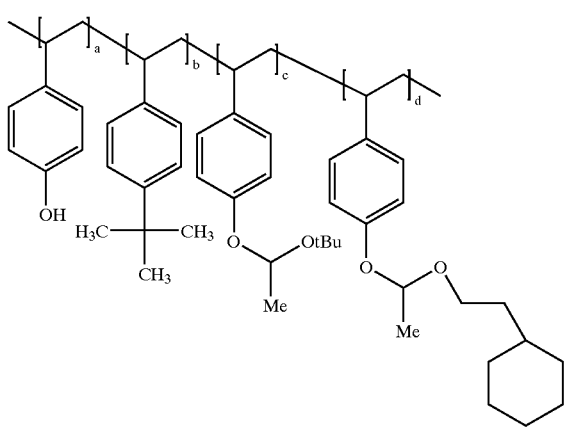

Polymer P2

Polymer P2 is [4-(1-ethoxyethoxy)styrene-co-4-hydroxystyrene 37:63] (MWP-240, a product of Wako Chemical].

Polymer P3

Polymer P3 is poly[(4-hydroxystyrene)-co-(tertiary-butyl acrylate)-co-(isobornyl acrylate)] (61:25:14) MW: which was custom synthesized by TriQuest, LP. The molecular weight was 16,600 daltons.

General Formulation Procedure

Photoresist components as described in the examples were mixed in an amber-bottle and stirred until a homogeneous solution was obtained. The solution was filtered through a 0.2 μm filter into a clean amber-bottle.

General Lithographic Procedure 1

Silicon wafers were first spun coated with DUV42P BARC (a product of Brewer Science, Inc., Rolla, Mo.) and proximity baked for 70 seconds at 205° C. to yield a BARC thickness of 62 nm. The resist samples were then applied over the BARC layer and prebaked on a hotplate for 90 seconds (temperature setting depended on the particular example) resulting in a resist film thickness of 325 nm. The resist samples were then exposed pattern-wise with a KrF excimer laser beam (248 nm) in a Canon FPA-3000 EX6 stepper through a photo mask containing a line/space pattern. A numerical aperture of 0.65NA was utilized, with a 2/3 annular setting. The exposed resist coated wafers were then subjected to PEB treatment on a 110° C. hot plate for 90 seconds. A 60 second puddle development treatment in a 0.262 N solution of tetramethylammonium hydroxide followed. The data was collected using a Hitachi Scanning Electron Microscope. The resist images were sheared cross-sectionally, and the images were magnified 80 k times.

General Lithographic Procedure 2

General Lithographic Procedure 2 is identical to General Lithographic Procedure 1 except that the BARC thickness was 80 nm and the photoresist thickness was 360 nm.

EXAMPLES 1–6

Formulations for Examples 1–6 were prepared as described in the General Formulation Procedure using various bis(perfluoroalkylsulfonyl)imide type PAGs, bis(t-butylsulfonyl)diazomethane (Wako Chemical), Polymer P1, Polymer P2, 1,8-diazobicyclo[5.4.0]undec-7-ene (DBU), tris[2-(2-methoxyethoxy)ethyl]amine (TMEA), antipyrene, and PGMEA according to the amounts listed in Table 1. Amounts listed in Table 1 are in units of grams. Formulations for Examples 1–6 were lithographically evaluated using General Lithographic Procedure 1. The wafers were examined in a scanning electron microscope for photospeed, resolution, DOF, and profile. The results are given in Table 2 with the corresponding softbake temperatures employed. Energy to size in Table 2 refers to the energy to resolve 130 nm line-space patterns with equal line and space widths.

TABLE 1

| Ex. | Polymer P1 | Polymer P2 | Bis(tert-butylsulfonyl) diazomethane | bis(per-fluoro-alkylsulfonyl) imide PAG | bis(perfluoro alkylsulfonyl) imide PAG Amount | DBU | TMEA | Anti-pyrene | PGMEA |
|---|---|---|---|---|---|---|---|---|---|
| 1 | 5.899 | 4.826 | 0.660 | PAG 1 | 0.552 | 0.033 | 0.006 | 0.017 | 88.00 |
| 2 | 5.899 | 4.826 | 0.660 | PAG 2 | 0.552 | 0.033 | 0.006 | 0.017 | 88.00 |
| 3 | 5.806 | 4.750 | 0.660 | PAG 3 | 0.720 | 0.033 | 0.006 | 0.017 | 88.00 |
| 4 | 5.806 | 4.750 | 0.660 | PAG 4 | 0.720 | 0.033 | 0.006 | 0.017 | 88.00 |
| 5** | 6.181 | 5.057 | — | PAG 3 | 0.720 | 0.032 | — | — | 88.00 |
| 6** | 5.806 | 4.750 | — | PAG 1 | 0.720 | 0.033 | 0.006 | 0.017 | 88.00 |

**Comparative Examples

TABLE 2

| | | Softbake Temperature (° C.) | PEB (° C.) | Energy to Size (mJ/cm2) | Resolution (μm) | DOF @ 130 nm (μm) | Slope | Profile Surface Quality | Comments |
|---|---|---|---|---|---|---|---|---|---|
| Ex. | | | | | | | | | |
| 1 | | 130 | 110 | 60 | 0.13 | 0.1 | Vertical | very cuspy | Slight sw's |
| 2 | | 130 | 110 | 63 | 0.13 | 0.3 | Vertical | Flat, Cusp | Slight sw's |

TABLE 2-continued

| Ex. | Softbake Temperature (° C.) | PEB (° C.) | Energy to Size (mJ/cm2) | Resolution (μm) | DOF @ 130 nm (μm) | Slope | Profile Surface Quality | Comments |
|---|---|---|---|---|---|---|---|---|
| 3 | 130 | 110 | 60 | 0.13 | 0.2 | Vertical | Flat, Cusp | Slight sw's |
| 4 | 130 | 110 | 55 | 0.13 | 0.4 | Vertical | Flat, Cusp | Slight sw's |
| 5** | 130 | 110 | 44 | 0.13 | 0.9 | Vertical | round top | Slight sw's |
| 6** | 130 | 110 | 46 | 0.13 | 0.6 | Vertical | Round Top | Slight sw's |

**Comparative Examples

The data in Table 2 indicates that rounded profile tops obtained using bis(perfluoroalkylsulfonyl)imide type PAGs can be improved in unoptimized formulations by the use of a bissulfonyldiazomethane type PAG.

EXAMPLES 7–24

Formulations for Examples 7–24 were prepared as described in the General Formulation Procedure using PAG 8 (the PAG from PAG Synthesis Example 12), bis(t-butylsulfonyl)diazomethane (Wako Chemical), Polymer P1, Polymer P2, 1,8-diazobicyclo[5.4.0]undec-7-ene (DBU), tris[2-(2-methoxyethoxy)ethyl]amine (TMEA), antipyrene, and PGMEA according to the amounts listed in Table 3. Amounts listed in Table 3 are in units of grams. Formulations for Examples 7–24 were lithographically evaluated using the General Lithographic Procedure 2. Several formulations were evaluated using different softbake conditions. In those cases, the results are additionally marked with the letters a, b or c in Table 4. The wafers were examined in a scanning electron microscope for photospeed, resolution, DOF, and profile. The results are given in Table 4 with the corresponding softbake temperatures employed. Energy to size in Table 4 refers to the energy to resolve 130 nm line-space patterns with equal line and space widths.

TABLE 4

| Ex. | Softbake Temperature (° C.) | Energy to Size (mJ/cm2) | DOF @ 130 nm (μm) | Slope | Profile Surface Quality | Comments Standing Wave |
|---|---|---|---|---|---|---|
| 7a | 100 | 31 | 0.6 | Vertical | Flat | Low sw's |
| 7b | 130 | 32 | NA | Retrograde | Flat, Cusp | Moderate sw's |
| 8 | 115 | 37 | 0.9 | Vertical | Flat, Rough | Slight sw's |
| 9a | 100 | 41.5 | 0.75 | Slight Slope | Round Top | Low sw's |
| 9b | 130 | 39 | NA | Retrograde | Flat, Cusp | Slight sw's |
| 10 | 100 | 37 | 0.8 | Slight Slope | Round Top | Low sw's |
| 11a | 115 | 43 | 0.9 | Slight Slope | Flat, Rough | Slight sw's |
| 11b | 130 | 44.5 | 0.7 | Vertical | Flat, Cusp | Moderate sw's |
| 12 | 115 | 44.5 | 0.85 | Slight Slope | Flat Top | Slight sw's |
| 13a | 100 | 41.5 | 0.5 | Moderate Slope | Round Top | Low sw's |

TABLE 3

| Ex. | Polymer P1 | Polymer P2 | Bis(tert-butylsulfonyl) diazomethane | PAG 8 | DBU | TMEA | Antipyrene | PGMEA |
|---|---|---|---|---|---|---|---|---|
| 7 | 5.796 | 4.742 | 0.176 | 0.264 | 0.015 | — | 0.007 | 89.00 |
| 8 | 5.796 | 4.742 | 0.176 | 0.264 | 0.019 | — | 0.003 | 89.00 |
| 9 | 5.796 | 4.742 | 0.176 | 0.264 | 0.022 | — | — | 89.00 |
| 10 | 5.637 | 4.612 | 0.286 | 0.429 | 0.025 | — | 0.011 | 89.00 |
| 11 | 5.637 | 4.612 | 0.286 | 0.429 | 0.030 | — | 0.005 | 89.00 |
| 12 | 5.637 | 4.612 | 0.286 | 0.429 | 0.036 | — | — | 89.00 |
| 13 | 5.478 | 4.482 | 0.396 | 0.594 | 0.035 | — | 0.015 | 89.00 |
| 14 | 5.478 | 4.482 | 0.396 | 0.594 | 0.042 | — | 0.007 | 89.00 |
| 15 | 5.478 | 4.482 | 0.396 | 0.594 | 0.050 | — | — | 89.00 |
| 16 | 5.743 | 4.699 | 0.209 | 0.314 | 0.024 | — | 0.010 | 89.00 |
| 17 | 5.695 | 4.660 | 0.242 | 0.363 | 0.028 | — | 0.012 | 89.00 |
| 18 | 5.792 | 4.739 | 0.176 | 0.264 | 0.021 | — | 0.009 | 89.00 |
| 19** | 5.669 | 4.638 | — | 0.660 | 0.020 | 0.03 | 0.010 | 89.00 |
| 20 | 5.605 | 4.586 | 0.077 | 0.693 | 0.023 | 0.004 | 0.012 | 89.00 |
| 21 | 5.605 | 4.586 | 0.308 | 0.462 | 0.039 | — | — | 89.00 |
| 22 | 5.605 | 4.586 | 0.154 | 0.616 | 0.039 | — | — | 89.00 |
| 23 | 5.764 | 4.716 | 0.099 | 0.396 | 0.025 | — | — | 89.00 |
| 24 | 5.605 | 4.586 | 0.308 | 0.462 | 0.023 | 0.004 | 0.012 | 89.00 |

**Comparative Example

TABLE 4-continued

| Ex. | Soft-bake Temperature (° C.) | Energy to Size (mJ/cm2) | DOF @ 130 nm (μm) | Slope | Profile Comments Surface Quality | Standing Wave |
|---|---|---|---|---|---|---|
| 13b | 115 | 39 | 0.9 | Slight Slope | Round Top | Slight sw's |
| 13c | 130 | 41.5 | 0.7 | Moderate Slope | Round Top | Slight sw's |

TABLE 4-continued

| Ex. | Soft-bake Temperature (° C.) | Energy to Size (mJ/cm2) | DOF @ 130 nm (μm) | Slope | Profile Comments Surface Quality | Standing Wave |
|---|---|---|---|---|---|---|
| 14 | 100 | 53.5 | 0.6 | Moderate Slope | Round Top | Low sw's |
| 15a | 100 | 55 | 0.7 | Very Sloped | Round Top | Low sw's |
| 15b | 130 | 52 | 0.8 | Slight Slope | Flat, Cusp | Moderate sw's |
| 16 | 100 | 42 | 0.8 | Vertical | Flat | Slight sw's |
| 17 | 100 | 43 | 0.8 | Vertical | Flat | Low sw's |
| 18 | 100 | 41 | 0.8 | Vertical | Flat, Rough | Low sw's |
| 19** | 130 | 37 | 0.4 | Very Sloped | Film Loss, Round | Slight sw's |
| 20 | 130 | 36 | 0.4 | Very Sloped | Film Loss, Round | Slight sw's |
| 21 | 130 | 47 | 0.75 | Very Sloped | Film Loss, Round | Moderate sw's |
| 22 | 130 | 43 | 0.75 | Vertical | Flat | Moderate sw's |
| 23 | 130 | 38 | 0.7 | Slight Slope | Flat | Heavy sw's |
| 24 | 130 | 38 | 0.5 | Vertical | Flat, Rough | Moderate sw's |

**Comparative Example

Data in Table 4 shows that when bis(perfluoroalkylsulfonyl)imide type PAGs were used as the sole PAG in the acetal protected PHS based formulations, (Example 19) sloped profiles with rounded tops, unexposed film thickness loss and poor DOF were obtained. However, use of the bissulfonyldiazomethane type PAG as a co-PAG resulted in obtaining a vertical profile with flat tops, no unexposed film loss, and excellent DOF (e.g. Example 11).

EXAMPLES 25–26

Formulation examples 25 and 26 were prepared as described in the General Formulation Procedure using PAG 8 (the PAG from PAG Synthesis Example 12), tris-(tert-butylphenyl)sulfonium bis-(perfluorobutanesulfonyl)imide (PAG 9 obtained from the 3M Corporation), Polymer P1, Polymer P2, bis(t-butylsulfonyl)diazomethane, 1,8-diazobicyclo[5.4.0]undec-7-ene (DBU), antipyrene and propylene glycol monomethyl ether acetate (PGMEA) according to the amounts listed in Table 5. Amounts listed in Table 5 are in units of grams. Formulation Examples 25 and 26 were lithographically evaluated using the General Lithographic Procedure 2. The wafers were examined in a scanning electron microscope for photospeed, resolution, DOF, and profile. The results are given in Table 6 with the corresponding softbake temperatures employed. Energy to size in Table 6 refers to the energy to resolve 130 nm line-space patterns with equal line and space widths.

TABLE 5

| Ex. | Polymer P1 | Polymer P2 | Bis(tert-butylsulfonyl)diazomethane | bis(perfluoro-alkylsulfonyl)imide PAG | bis(perfluoro-alklysulfonyl)imide PAG amount | DBU | Antipyrene | PGMEA |
|---|---|---|---|---|---|---|---|---|
| 25 | 5.796 | 4.742 | 0.242 | PAG 9 | 0.363 | 0.028 | 0.012 | 89.00 |
| 26 | 5.796 | 4.742 | 0.242 | PAG 8 | 0.363 | 0.028 | 0.012 | 89.00 |

TABLE 6

| Ex. | Softbake Temperature (° C.) | Resolution Dense Ln | Energy to Size (130 nm) (mJ/cm2) | DOF @ 130 nm (μm) | Slope | Profile Comments Surface Quality | Standing Wave |
|---|---|---|---|---|---|---|---|
| 25 | 130 | 130 nm | 40 | 0.5 | Slight Slope | Round | Low sw's |
| 26 | 130 | 130 nm | 40 | 0.8 | Slight Slope | Flat | Low sw's |

Results in Table 6 suggest that unsymmetric bis-(perfluorobutanesulfonyl)imides have slightly improved performance over symmetrical bis-(perfluorobutanesulfonyl)imides.

EXAMPLES 27–30

Formulations for Examples 27–30 were prepared as described in the General Formulation Procedure using PAG 8 (the PAG from PAG Synthesis Example 12), tris-(tert-butylphenyl)sulfonium bis-(perfluorobutanesulfonyl)imide (PAG 9 obtained from the 3M Corporation), Polymer P3, bis(t-butylsulfonyl)diazomethane, 1,8-diazobicyclo[5.4.0] undec-7-ene (DBU), tris[2-(2-methoxyethoxy)ethyl]amine (TMEA), antipyrene and propylene glycol monomethyl ether acetate (PGMEA) according to the amounts listed in Table 7. Amounts listed in Table 7 are in units of grams. Formulations for Examples 27–30 were lithographically evaluated using the General Lithographic Procedure 2. The wafers were examined in a scanning electron microscope for photospeed, resolution, DOF, and profile. The results are given in Table 8 with the corresponding softbake temperatures employed. Energy to size in Table 8 refers to the energy to resolve 130 nm line-space patterns with equal line and space widths.

TABLE 7

| Ex. | Polymer P3 | PAG 8 | Bis(tert-butyl-sulfonyl)diazo-methane | PAG 9 | DBU | Anti-pyrene | PGMEA |
|---|---|---|---|---|---|---|---|
| 27 | 10.355 | 0.363 | 0.242 | — | 0.028 | 0.012 | 89.00 |
| 28 | 10.355 | — | 0.242 | 0.363 | 0.028 | 0.012 | 89.00 |
| 29 | 10.307 | 0.66 | — | — | 0.02 | 0.01 | 89.00 |
| 30** | 10.307 | — | — | 0.66 | 0.02 | 0.01 | 89.00 |

**Comparative Example

TABLE 8

| Ex. | Softbake Temperature (°C.) | Energy to Size (mJ/cm2) | DOF @ 130 nm (μm) | Slope | Surface Quality | Standing Wave |
|---|---|---|---|---|---|---|
| 27 | 140 | 75* | DNR | Retrograde | Flat, Cusp*** | Low sw's*** |
| 28 | 140 | 84* | DNR | Retrograde | Round, Cusp*** | Low sw's*** |
| 29 | 140 | 44 | 0.8 | Sloped | Round | Heavy sw's |
| 30** | 140 | 48 | 0.4 | Slight Slope | Round | Heavy sw's |

*did not resolve
**Comparative Example
***on 140 nm features

The lithographic results in Table 8 show that in an ESCAP type polymer matrix, the use of a bissulfonyldiazomethane type co-PAG blend with bis(perfluoroalkylsulfonyl)imide type PAGs had an adverse effect on the lithographic performance.

EXAMPLES 31 AND 32

Formulations for Examples 31 and 32 were prepared as described in the General Formulation Procedure using PAG 8 (the PAG from PAG Synthesis Example 12), tris-(tert-butylphenyl)sulfonium perfluorobutanesulfonate (TTBPS-nonaflate), Polymer P1, Polymer P2, bis(t-butylsulfonyl)diazomethane, 1,8-diazobicyclo[5.4.0]undec-7-ene (DBU), tris[2-(2-methoxyethoxy)ethyl]amine (TMEA), antipyrene and propylene glycol monomethyl ether acetate (PGMEA) according to the amounts listed in Table 9. Amounts listed in Table 9 are in units of grams. Formulations for Examples 31 and 32 were lithographically evaluated using the General Lithographic Procedure 2 and under an alternate film thickness condition of 340 nm as noted in Table 10. The wafers were examined in a scanning electron microscope for photospeed, resolution, DOF, and profile. The results are given in Table 10 with the corresponding softbake temperatures employed. Energy to size in Table 10 refers to the energy to resolve 130 nm line-space patterns with equal line and space widths.

TABLE 9

| Ex. | Polymer P1 | Polymer P2 | Bis(tert-butylsulfonyl)diazomethane | co-PAG | co-PAG amount | DBU | TMEA | Anti-pyrene | PGMEA |
|---|---|---|---|---|---|---|---|---|---|
| 31** | 5.467 | 4.473 | 0.605 | TTBPS-Nonaflate | 0.403 | 0.03 | 0.005 | 0.015 | 89.00 |
| 32 | 5.61 | 4.586 | 0.308 | PAG 9 | 0.462 | 0.039 | — | 0 | 89.00 |

**Comparative Example

TABLE 10

| Ex. | Softbake Temperature (°C.) | Resolution Dense Ln | Energy to Size (130 nm) (mJ/cm2) | DOF @ 130 nm (μm) | Resist Film Thickness (nm) | Slope | Profile Comments Surface Quality | Standing Wave |
|---|---|---|---|---|---|---|---|---|
| 31a** | 130 | 130 nm | 48 | 0.6 | 340 | Slight Slope | Round | Slight sw's |
| 31b** | 130 | 130 nm | 46 | 0.3 | 360 | Vertical | Flat, Cusp | Moderate sw's |
| 32a | 130 | 130 nm | 48 | 0.7 | 340 | Vertical | Round | Moderate sw's |
| 32b | 130 | 130 nm | 47 | 0.7 | 360 | Vertical | Flat | Moderate sw's |

**Comparative Example

The results in Table 10 illustrate the problem in prior art resists of photoresist performance change with changes in photoresist film thickness. Such film thickness differences occur when photoresist is coated over substrates with existing topography. The prior art formulation in Example 31 has significantly different and lower DOF at photoresist film thicknesses differing only by 20 nm. At one film thickness, the DOF is limited by bridging of the images. At the other photoresist film thickness, DOF is limited by line collapse. The formulation of this invention (Example 32) is not as limited by these problems and thus has higher and less variable DOF with changes in photoresist film thickness.

EXAMPLES 33–38

Formulations for Examples 33–38 were prepared as described in the General Formulation Procedure using combinations of various bis(perfluoroalkylsulfonyl)-imide type PAGs, one of two bis(sulfonyl)diazomethane co-PAGs, Polymer P1, Polymer P2, 1,8-diazobicyclo[5.4.0]undec-7-ene (DBU), antipyrene, and 89 parts PGMEA according to the amounts listed in Table 11. Amounts listed in Table 11 are in parts. The formulations were lithographically tested employing General Lithographic Procedure 2 using a 110° C. softbake for all formulations. Results are tabulated in Table 12.

Results from these experiments show that addition of symmetrical or unsymmetrical perfluorosulfonyl imide type PAG or mixtures thereof to bis(sulfonyl) diazomethane type PAGs improves lithographic performance.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. A radiation sensitive composition comprising:

a) a first photoacid generator (PAG) compound P1, which comprises one or more compounds of the structure (A);

b) a second photoacid generator compound P2 which comprises one or more compounds of the structure (B);

c) a polymer component comprising an alkali soluble resin component whose alkali solubility is suppressed by the presence of acid sensitive moieties and whose alkali solubility is returned by treatment with an acid and, optionally, heat; wherein said polymer comprises one or more polymers comprising the monomer unit (C); and d) a solvent;

TABLE 11

| Ex. | Polymer P1 | Polymer P2 | Bis(sulfonyl) diazomethane/ amount | First bis(perfluoroalkylsulfonyl) imide PAG | First PAG amount | Second bis(perfluoroalkylsulfonyl) imide PAG | Second PAG Amount | DBU | Antipyrene |
|---|---|---|---|---|---|---|---|---|---|
| 33** | 5.706 | 4.669 | t-butyl/0.605 | | | | | 0.014 | 0.006 |
| 34 | 5.701 | 4.146 | t-butyl/0.121 | PAG 8 | 0.182 | PAG 3 | 0.182 | 0.021 | 0.009 |
| 35 | 10.365 | 0 | t-butyl/0.242 | PAG 8 | 0.362 | | | 0.021 | 0.009 |
| 36 | 5.696 | 4.142 | t-butyl/0.242 | PAG 6 | 0.363 | | | 0.027 | 0.012 |
| 37 | 5.701 | 4.664 | Cyclohexyl/0.242 | PAG 8 | 0.363 | | | 0.021 | 0.009 |
| 38 | 5.696 | 4.142 | t-butyl/0.242 | PAG 9 | 0.182 | PAG 10* | 0.182 | 0.027 | 0.012 |

**Comparative Example
*PAG 10 = tris-(tert-butylphenyl)sulfonium-bis-(trifluoromethanesulfonyl)imide obtained from the 3M Corporation.

TABLE 12

| Ex. | Softbake Temperature (° C.) | PEB (° C.) | Energy to Size (130 nm) (mJ/cm2) | Resolution (μm) | DOF @ 130 nm (μm) | Slope | Profile Surface Quality | Standing Waves |
|---|---|---|---|---|---|---|---|---|
| 33** | 110 | 110 | 32 | 0.13 | 0.2 | Retrograde | Round | Low |
| 34 | 110 | 110 | 48 | 0.13 | 0.6 | Slight Slope | Flat | Slight |
| 35 | 110 | 110 | 38 | 0.13 | 0.4 | Vertical | Flat | Low |
| 36 | 110 | 110 | 35 | 0.13 | 0.6 | Slight Slope | Round | Slight |
| 37 | 110 | 110 | 45 | 0.13 | 0.8 | Vertical | Round | Moderate |
| 38 | 110 | 110 | 48 | 0.13 | 0.6 | Slight Slope | Round | Slight |

**Comparative Example wherein structure (A) has the formula:

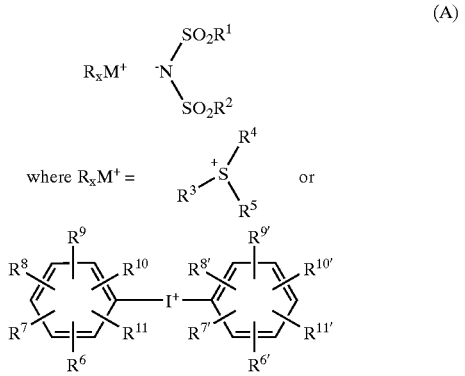

wherein $R^1$ and $R^2$ are each independently selected from the group consisting of $C_1-C_{12}$ fluoroalkyl groups or together $R^1$ and $R^2$ are joined with the N to form a $(F_2C)_yN$ ring where y=4–12; $R^3$, $R^4$, and $R^5$ are each independently selected from the group consisting of unsubstituted aryl, alkyl or alpha-ketomethyl groups or such groups substituted with an acid sensitive group, or $R^3$ and $R^4$ together with the S atom form a cycloalkylsulfonium ring; $R^6$ to $R^{11}$ and $R^{6'}$ to $R^{11'}$ are independently selected from the group consisting of branched or linear alkyl, alkoxy, halogen, hydrogen, $OCO_2G$, $OCH_2CO_2G$, and OG where G=an acid sensitive group;

wherein structure (B) has the formula:

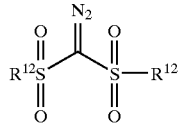

wherein each $R^{12}$ is independently selected from the group consisting of a linear, cyclic, or branched $C_1-C_8$ fluoroalkyl group, substituted or unsubstituted phenyl group, substituted or unsubstituted naphthalene group, $C_6-C_{12}$ cyclic or alicyclic hydrocarbon, and a linear, cyclic, or branched $C_1-C_8$ alkyl group; and wherein monomeric unit (C) has the formula:

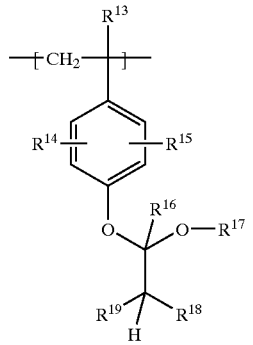

wherein $R^{13}$ is selected from the group consisting of H, $C_1-C_4$ lower alkyl, CN, and $CH_2CO_2R^{20}$; $R^{14}$ and $R^{15}$ are each independently selected from the group consisting of H, linear or branched $C_1-C_4$ alkyl, and halogen; $R^{16}$ is selected from the group consisting of H and branched or linear $C_1-C_4$ alkyl; $R^{17}$ is selected from the group consisting of substituted or unsubstituted phenyl, a substituted or unsubstituted linear, branched or cyclic $C_1-C_{20}$ alkyl, optionally containing an ether or ester group, a substituted or unsubstituted phenylalkylene, and a substituted or unsubstituted $C_6-C_{20}$ cyclic alkylene ; $R^{18}$ and $R^{19}$ are each independently selected from the group consisting of H, linear or branched or cyclic $C_1-C_{14}$ alkyl, and $C_7-C_{14}$ alicyclic; $R^{20}$ is selected from the group consisting of a $C_1-C_{14}$ branched, linear or cyclic alkyl, substituted or unsubstituted phenyl, and $C_7-C_{14}$ alicyclic group.

2. The radiation sensitive composition of claim 1 wherein the total amount of photoactive generator content in the composition is from about 0.05 to about 20 wt % of the solids content of the composition and photoactive generator compound P1 comprises from about 25 to about 99 wt % and the second photoactive generator compound P2 comprises from about 1 to about 75 wt % of the total photoactive generator content of the composition.

3. The radiation sensitive composition of claim 1 wherein the total amount of photoactive generator content in the composition is from about 1 to about 15 wt % of the solids content of the composition and photoactive generator compound P1 comprises from about 35 to about 90 wt % and the second photoactive generator compound P2 comprises from about 10 to about 65 wt % of the total photoactive generator content of the composition.

4. The radiation sensitive composition of claim 1 wherein the total amount of photoactive generator content in the composition is from about 0.05 to about 20 wt % of the solids content of the composition and photoactive generator compound P1 comprises from about 60 to about 80 wt % and the second photoactive generator compound P2 comprises from about 20 to about 40 wt % of the total photoactive generator content of the composition.

5. The radiation sensitive composition of claim 1 wherein the polymer component comprises from about 75 to about 95 wt % of the total solids content of the composition.

6. The radiation sensitive composition of claim 1 wherein in structure (A) M is S and $R^1$ and $R^2$ are $C_1-C_6$ perfluoroalkyl and in structure (B) $R^{12}$ is linear, branched or cyclic $C_1-C_7$ alkyl.

7. The radiation sensitive composition of claim 6 wherein $R^1$ and $R^2$ are different $C_1-C_6$ perfluoroalkyl groups.

8. The radiation sensitive composition of claim 1 wherein in photoactive generator compound P1 the $(R^1SO_2NSO_2R^2)^-$ group is selected from the group consisting of $(CF_3SO_2NSO_2CF_3)^-$
$(CF_3CF_2CF_2CF_2CF_2CF_2CF_2CF_2SO_2NSO_2CF_3)^-$
$(CF_3CF_2SO_2NSO_2NCF_2CF_3)^-$

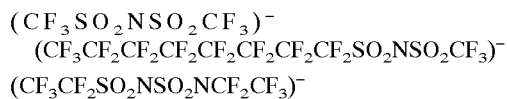
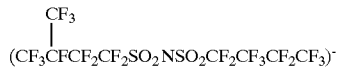

(CF₃CF₂CF₂CF₂SO₂NSO₂CF₂CF₂CF₂CF₃)⁻
(CF₃CF₂SO₂NSO₂CF₃)⁻
(CF₃CF₂CF₂SO₂NSO₂CF₂CF₂CF₂CF₂CF₃)⁻
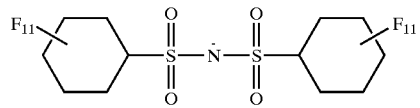
(CF₃CF₂CF₂CF₂SO₂NSO₂CF₃)⁻
(CF₃CF₂CF₂CF₂CF₂CF₂CF₂CF₂SO₂NSO₂CF₂CF₂CF₂
CF₂CF₂CF₂CF₂CF₃)⁻
(CF₃(CF₂)₇SO₂NSO₂CF₃)⁻
and the substituted or unsubstituted R³R⁴R⁵S+ group is selected from the group consisting of:
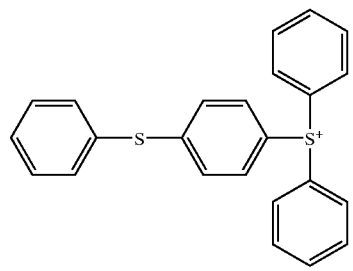
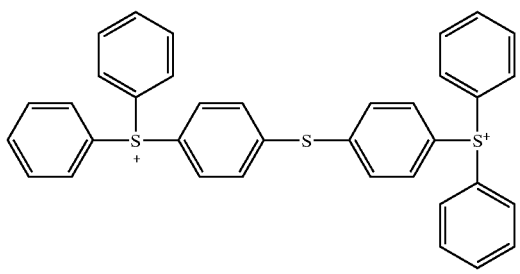
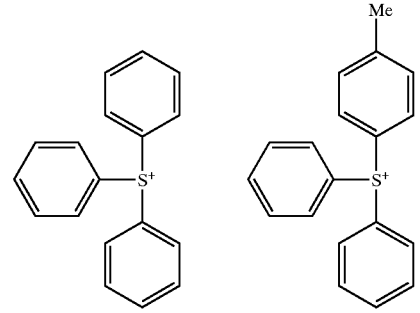
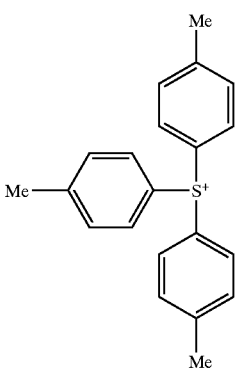
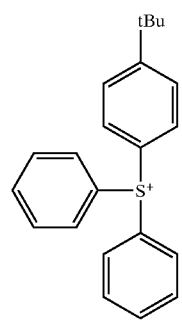
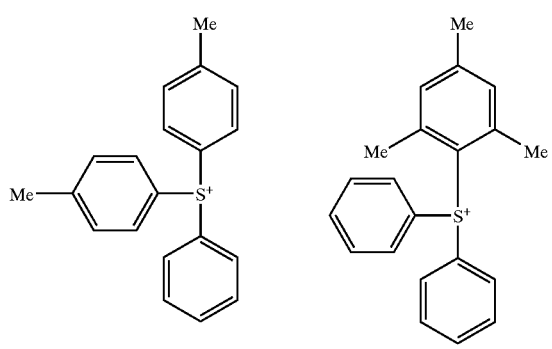
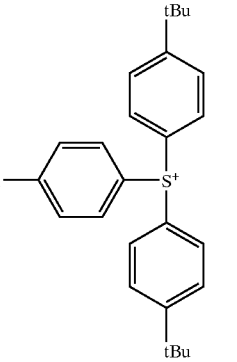
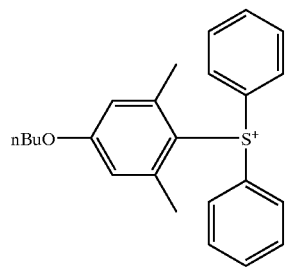
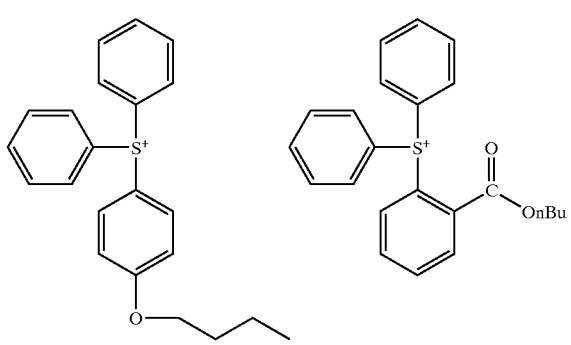
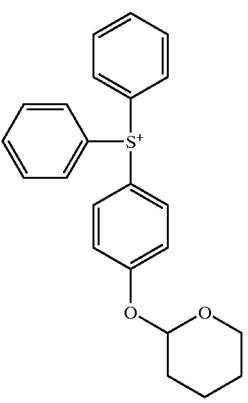
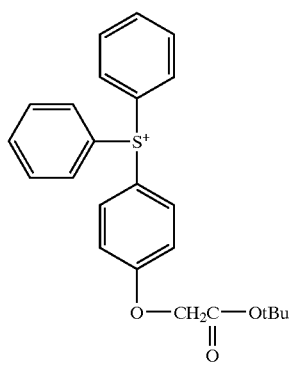

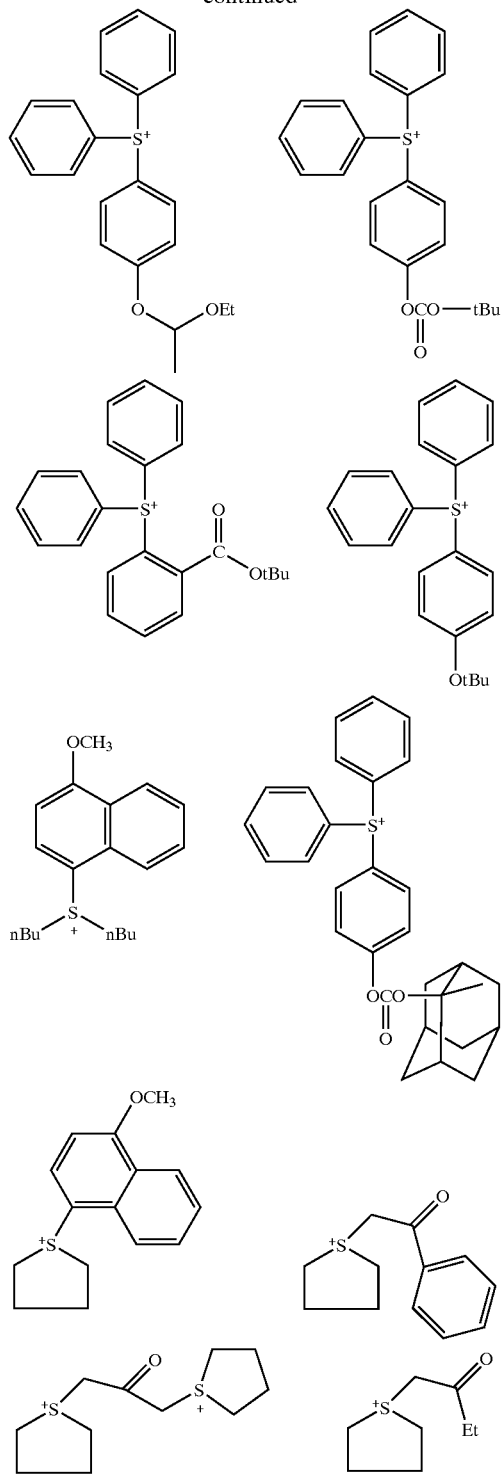

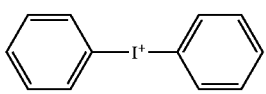

the diaryl iodonium cation is are selected from the group consisting of:

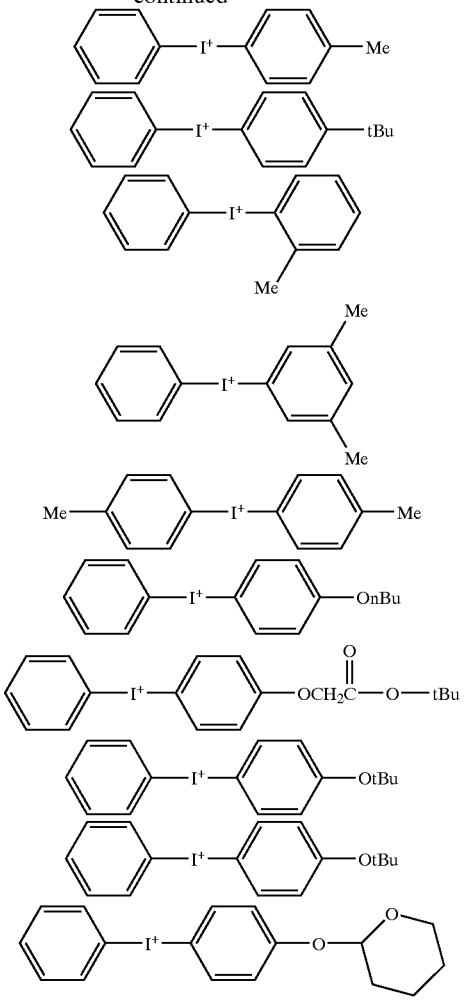

and in the second photoacid generator compound P2 each $R^{12}$ is independently selected from the group consisting of methyl, ethyl, n-butyl, t-butyl, cyclohexyl, perfluorobutyl, phenyl, methoxyphenyl, bromophenyl, 4-methoxynaphthalene, naphthalene and adamantly; and in the polymer comprising monomeric unit (C), $R^{13}$, $R^{14}$, $R^{15}$, $R^{16}$, $R^{18}$, and $R^{19}$=H and $R^{17}$ is selected from the group consisting of $C_1$–$C_4$ linear or branched alkyl and a substituted or unsubstituted $C_6$–$C_{20}$ cyclic alkylene.

9. The radiation sensitive composition of claim 8 wherein the polymer component comprises an additional monomer unit selected from the group consisting of acrylates, methacrylates, vinyl ethers, vinyl esters, substituted and unsubstituted styrenes.

10. The radiation sensitive composition of claim 1 wherein the polymer component comprises an additional monomeric unit that is hydroxystyrene.

11. The radiation sensitive composition of claim 1 wherein photoactive generator compound P1 is selected from the group consisting of
4-(1-butoxyphenyl)diphenylsulfonium bis-(perfluorobutanesulfonyl)imide,
4-(1-butoxyphenyl)diphenylsulfonium bis-(perfluoroethanesulfonyl)imide,
2,4,6-trimethylphenyldiphenylsulfonium bis-perfluorobutanesulfonyl)imide, 2,4,6-trimethylphenyldiphenylsulfonium bis-(perfluoroethanesulfonyl)imide, toluenediphenylsulfonium bis-(perfluorobutanesulfonyl)imide, toluenediphenylsulfonium bis-(perfluoroethanesulfonyl)imide, toluenediphenylsulfonium-(trifluoromethyl perfluorobutylsulfonyl)imide, tris-(tert-butylphenyl)sulfonium-(trifluoromethyl perfluorobutylsulfonyl)imide, tris-(tert-butylphenyl)sulfonium bis-(perfluorobutanesulfonyl)imide, tris-(tert-butylphenyl)sulfonium-bis-(trifluoromethanesulfonyl)imide the photoactive generator compound P2 is bis(tert-butylsulfonyl)imide, and the polymer component is selected from 4-[1-(2-cyclohexylethoxy)-ethoxy]styrene-co-4-[1-(t-butoxy)-ethoxy]styrene-co-4-hydroxy styrene-co-4-t-butylstyrene copolymer, [4-(1-ethoxyethoxy)styrene-co-4-hydroxystyrene, and mixtures thereof.

12. A process for producing a patterned image on a substrate, the process comprising the steps of:
  a. coating on a suitable substrate a radiation sensitive composition of claim 1, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

13. A process for producing a patterned image on a substrate, the process comprising the steps of:
  a. coating on a suitable substrate a radiation sensitive composition of claim 2, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

14. A process for producing a patterned image on a substrate, the process comprising the steps of:
  a. coating on a suitable substrate a radiation sensitive composition of claim 3, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

15. A process for producing a patterned image on a substrate, the process comprising the steps of:
  a. coating on a suitable substrate a radiation sensitive composition of claim 4, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

16. A process for producing a patterned image on a substrate, the process comprising the steps of:
  a. coating on a suitable substrate a radiation sensitive composition of claim 5, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

17. A process for producing a patterned image on a substrate, the process comprising the steps of:
  a. coating on a suitable substrate a radiation sensitive composition of claim 6, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

18. A process for producing a patterned image on a substrate, the process comprising the steps of:
  a. coating on a suitable substrate a radiation sensitive composition of claim 7, thereby forming a coated substrate;
  b. prebaking the coated substrate;
  c. exposing the prebaked coated substrate to actinic radiation;
  d. optionally post-baking the exposed coated substrate;
  e. developing the exposed coated substrate with a developer thereby forming an uncured relief image on the coated substrate; and
  f. baking the developed coated substrate at an elevated temperature thereby curing the image.

19. A process for producing a patterned image on a substrate, the process comprising the steps of:
  a. coating on a suitable substrate a radiation sensitive composition of claim 8, thereby forming a coated substrate;
  b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. baking the developed coated substrate at an elevated temperature thereby curing the image.

20. A process for producing a patterned image on a substrate, the process comprising the steps of:

a. coating on a suitable substrate a radiation sensitive composition of claim 9, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. baking the developed coated substrate at an elevated temperature thereby curing the image.

21. A process for producing a patterned image on a substrate, the process comprising the steps of:

a. coating on a suitable substrate a radiation sensitive composition of claim 10, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. baking the developed coated substrate at an elevated temperature thereby curing the image.

22. A process for producing a patterned image on a substrate, the process comprising the steps of:

a. coating on a suitable substrate a radiation sensitive composition of claim 11, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. baking the developed coated substrate at an elevated temperature thereby curing the image.

* * * * *